United States Patent
Mataya et al.

(10) Patent No.: US 9,123,686 B2
(45) Date of Patent: Sep. 1, 2015

(54) THERMAL MANAGEMENT FOR SOLID-STATE DRIVE

(71) Applicant: Western Digital Technologies, Inc., Irvine, CA (US)

(72) Inventors: Richard A. Mataya, Rancho Santa Margarita, CA (US); Tegan Campbell, Dana Point, CA (US)

(73) Assignee: Western Digital Technologies, Inc., Irvine, CA (US)

(*) Notice: Subject to any disclaimer, the term of this patent is extended or adjusted under 35 U.S.C. 154(b) by 80 days.

(21) Appl. No.: 13/904,992

(22) Filed: May 29, 2013

(65) Prior Publication Data

US 2014/0306335 A1    Oct. 16, 2014

Related U.S. Application Data

(60) Provisional application No. 61/811,577, filed on Apr. 12, 2013.

(51) Int. Cl.

| | |
|---|---|
| *H01L 23/34* | (2006.01) |
| *H01L 23/373* | (2006.01) |
| *B82Y 10/00* | (2011.01) |
| *H01L 23/367* | (2006.01) |
| *H01L 23/42* | (2006.01) |
| *H01L 23/498* | (2006.01) |

(52) U.S. Cl.
CPC ............ *H01L 23/373* (2013.01); *B82Y 10/00* (2013.01); *H01L 23/3677* (2013.01); *H01L 23/3672* (2013.01); *H01L 23/3675* (2013.01); *H01L 23/3736* (2013.01); *H01L 23/42* (2013.01); *H01L 23/49855* (2013.01); *H01L 2224/16225* (2013.01); *H01L 2224/32245* (2013.01); *H01L 2224/73253* (2013.01); *Y10S 977/734* (2013.01); *Y10S 977/932* (2013.01)

(58) Field of Classification Search
USPC .................................. 257/712–715, 737–740
See application file for complete search history.

(56) References Cited

U.S. PATENT DOCUMENTS

| | | |
|---|---|---|
| 6,856,556 B1 | 2/2005 | Hajeck |
| 7,126,857 B2 | 10/2006 | Hajeck |
| 7,430,136 B2 | 9/2008 | Merry, Jr. et al. |
| 7,447,807 B1 | 11/2008 | Merry et al. |
| 7,502,256 B2 | 3/2009 | Merry, Jr. et al. |
| 7,509,441 B1 | 3/2009 | Merry et al. |
| 7,596,643 B2 | 9/2009 | Merry, Jr. et al. |
| 7,653,778 B2 | 1/2010 | Merry, Jr. et al. |
| 7,685,337 B2 | 3/2010 | Merry, Jr. et al. |

(Continued)

OTHER PUBLICATIONS

International Search Report and Written Opinion dated Aug. 14, 2014 from related PCT Serial No. PCT/US2014/033699, 10 pages.

*Primary Examiner* — Marvin Payen
(74) *Attorney, Agent, or Firm* — McDermott Will & Emery LLP

(57) ABSTRACT

An electronic device including a printed circuit board (PCB) including a thermal conduction plane and at least one heat generating component mounted on the PCB and connected to the thermal conduction plane. A frame is connected to the PCB so as to define a first thermally conductive path between at least a portion of the frame and the at least one heat generating component. The electronic device further includes at least one thermally conductive layer between the frame and the at least one heat generating component so as to define a second thermally conductive path between at least a portion of the frame and the at least one heat generating component.

29 Claims, 5 Drawing Sheets

(56) References Cited

U.S. PATENT DOCUMENTS

| | | |
|---|---|---|
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,944,703 B2 | 5/2011 | Ni et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,154,116 B2 | 4/2012 | Sasaki et al. |
| 8,161,227 B1 | 4/2012 | Diggs et al. |
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,319,351 B2 | 11/2012 | Lee et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,456,856 B2 | 6/2013 | Lin et al. |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,745,277 B2 | 6/2014 | Kan |
| 2005/0254215 A1 | 11/2005 | Khbeis et al. |
| 2010/0033935 A1 | 2/2010 | Chainer |
| 2010/0097767 A1 | 4/2010 | Jude et al. |
| 2010/0128432 A1 | 5/2010 | Miller et al. |
| 2010/0174849 A1 | 7/2010 | Walston et al. |
| 2010/0246152 A1 | 9/2010 | Lin et al. |
| 2010/0250793 A1 | 9/2010 | Syu |
| 2011/0099323 A1 | 4/2011 | Syu |
| 2011/0283049 A1 | 11/2011 | Kang et al. |
| 2012/0031651 A1 | 2/2012 | Tseng et al. |
| 2012/0206882 A1* | 8/2012 | Mohammed et al. .......... 361/710 |
| 2012/0260020 A1 | 10/2012 | Suryabudi et al. |
| 2012/0278531 A1 | 11/2012 | Horn |
| 2012/0281361 A1 | 11/2012 | Gunderson et al. |
| 2012/0281364 A1 | 11/2012 | Gunderson |
| 2012/0284460 A1 | 11/2012 | Guda |
| 2012/0324191 A1 | 12/2012 | Strange et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0115427 A1 | 4/2014 | Guangming |
| 2014/0133220 A1 | 5/2014 | Danilak et al. |
| 2014/0136753 A1 | 5/2014 | Tomlin et al. |

* cited by examiner

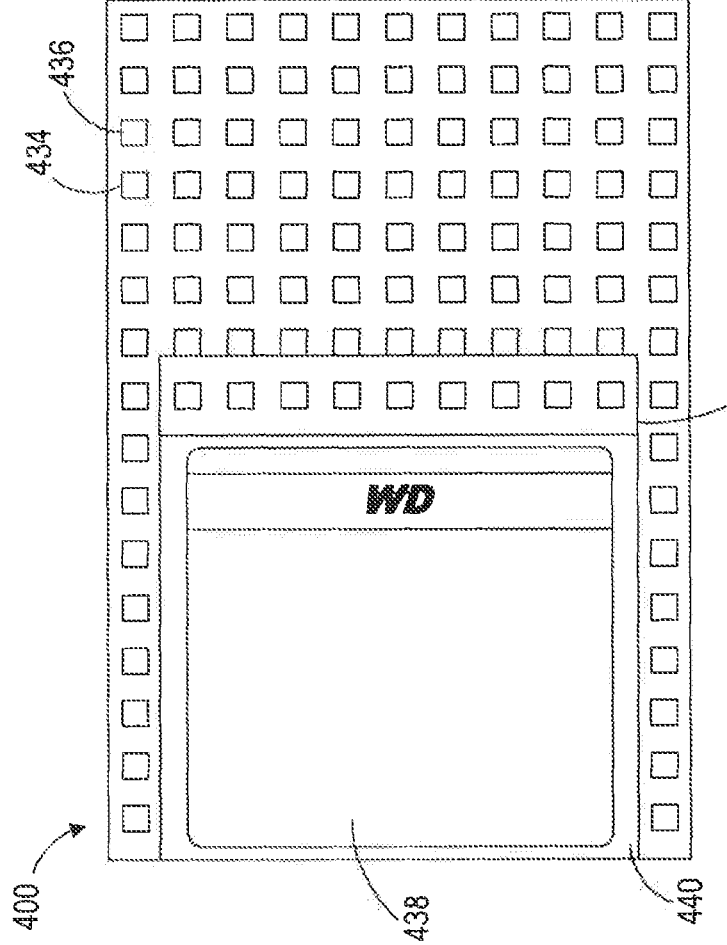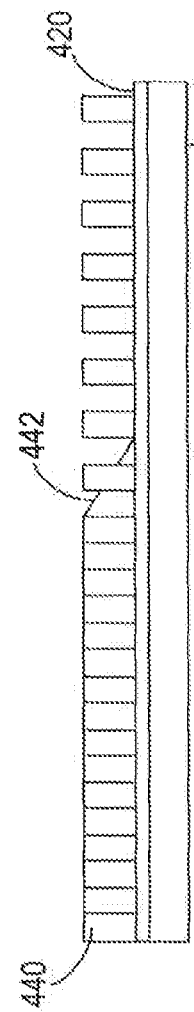

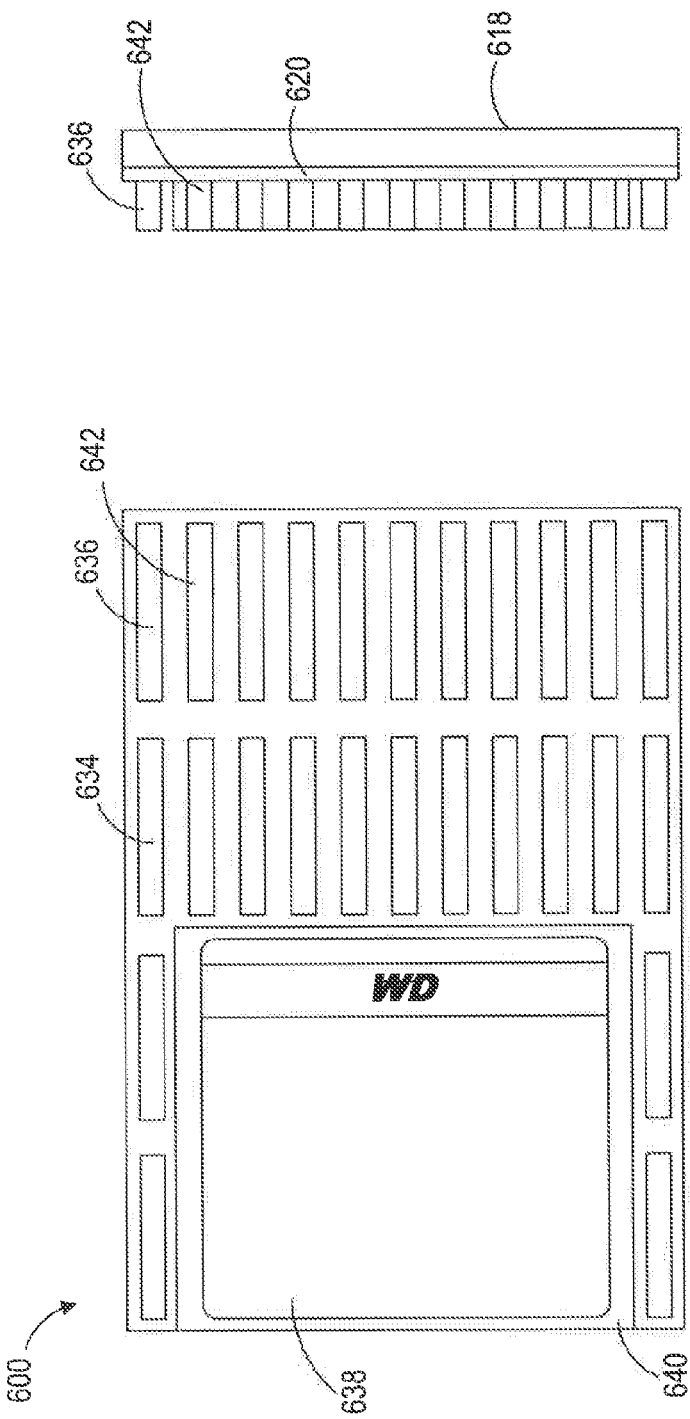
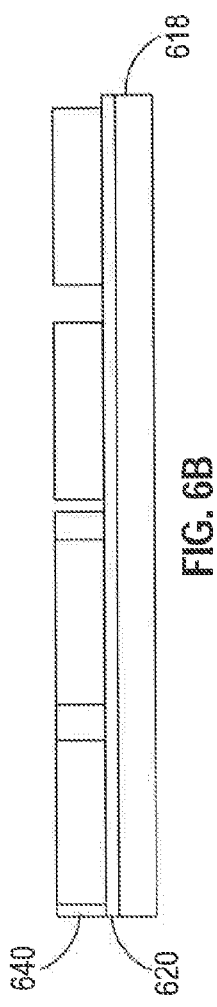
FIG. 6C
FIG. 6A
FIG. 6B

THERMAL MANAGEMENT FOR SOLID-STATE DRIVE

CROSS-REFERENCE TO RELATED APPLICATION

This application claims the benefit of U.S. Provisional Application No. 61/811,577, filed on Apr. 12, 2013, which is hereby incorporated by reference in its entirety.

BACKGROUND

Solid-state drives (SSDs) are a type of data storage device that use a non-volatile solid-state memory, such as a flash memory, to store data. As SSD performance demands increase, power requirements generally increase. In addition, physical size requirements for SSDs generally stay the same or become smaller.

The increase in power requirements without a corresponding increase in physical size leads to challenges to dissipate more heat from SSDs. In addition, new standards for SSDs may specify reduced airflows over SSDs and higher ambient temperatures which further hinder heat dissipation.

BRIEF DESCRIPTION OF THE DRAWINGS

The features and advantages of the embodiments of the present disclosure will become more apparent from the detailed description set forth below when taken in conjunction with the drawings. The drawings and the associated descriptions are provided to illustrate embodiments of the disclosure and not to limit the scope of what is claimed.

FIG. 4A provides a top view of an exterior of an SSD according to an embodiment.

FIG. 4B provides a side view of the exterior of the SSD of FIG. 4A according to an embodiment.

FIG. 6A provides a top view of an exterior of an SSD according to an embodiment.

FIG. 6B provides a side view of the exterior of the SSD of FIG. 6A according to an embodiment.

FIG. 6C provides a different side view of the exterior of the SSD of FIGS. 6A and 6B according to an embodiment.

DETAILED DESCRIPTION

In the following detailed description, numerous specific details are set forth to provide a full understanding of the present disclosure. It will be apparent, however, to one of ordinary skill in the art that the various embodiments disclosed may be practiced without some of these specific details. In other instances, well-known structures and techniques have not been shown in detail to avoid unnecessarily obscuring the various embodiments.

Figure 1:
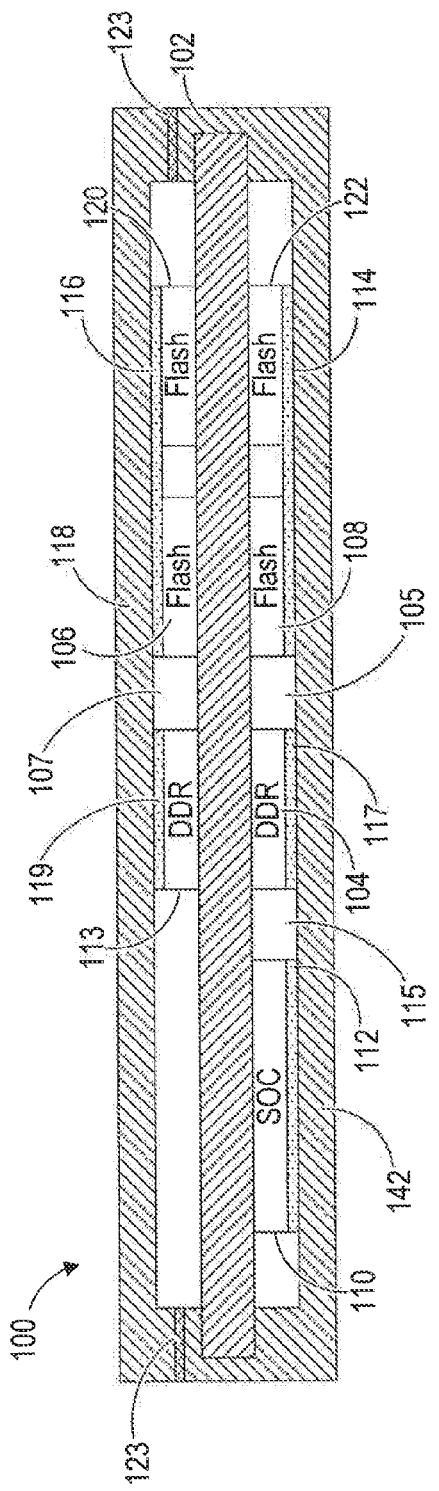
FIG. 1 is a cross-section view of a solid-state drive (SSD) according to an embodiment.
Figure 2:
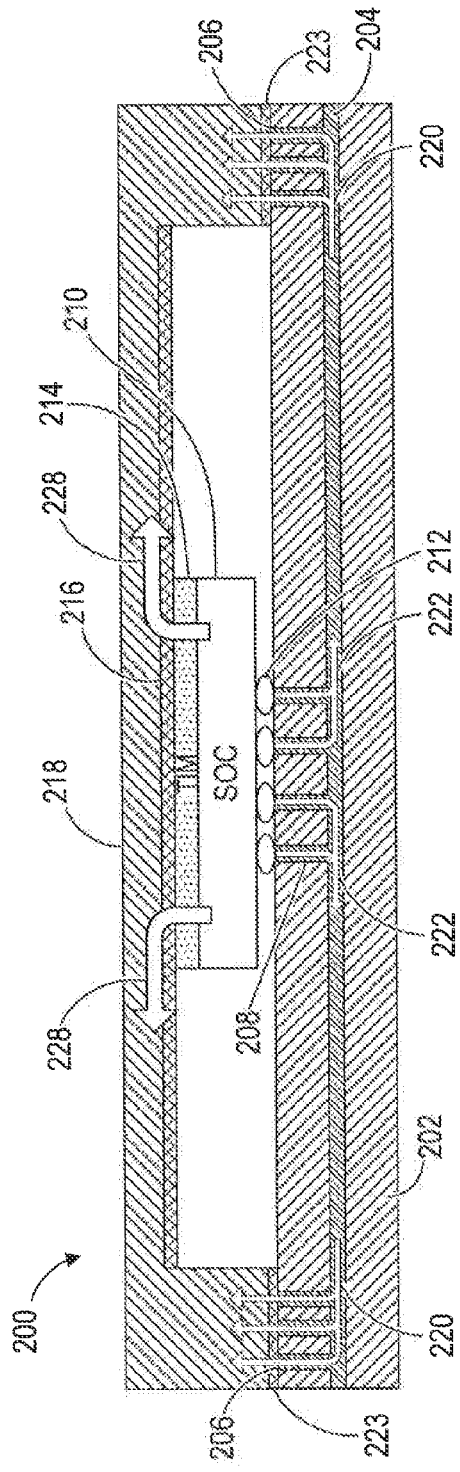
FIG. 2 is a cross-section view of an SSD according to an embodiment.
Figure 3:
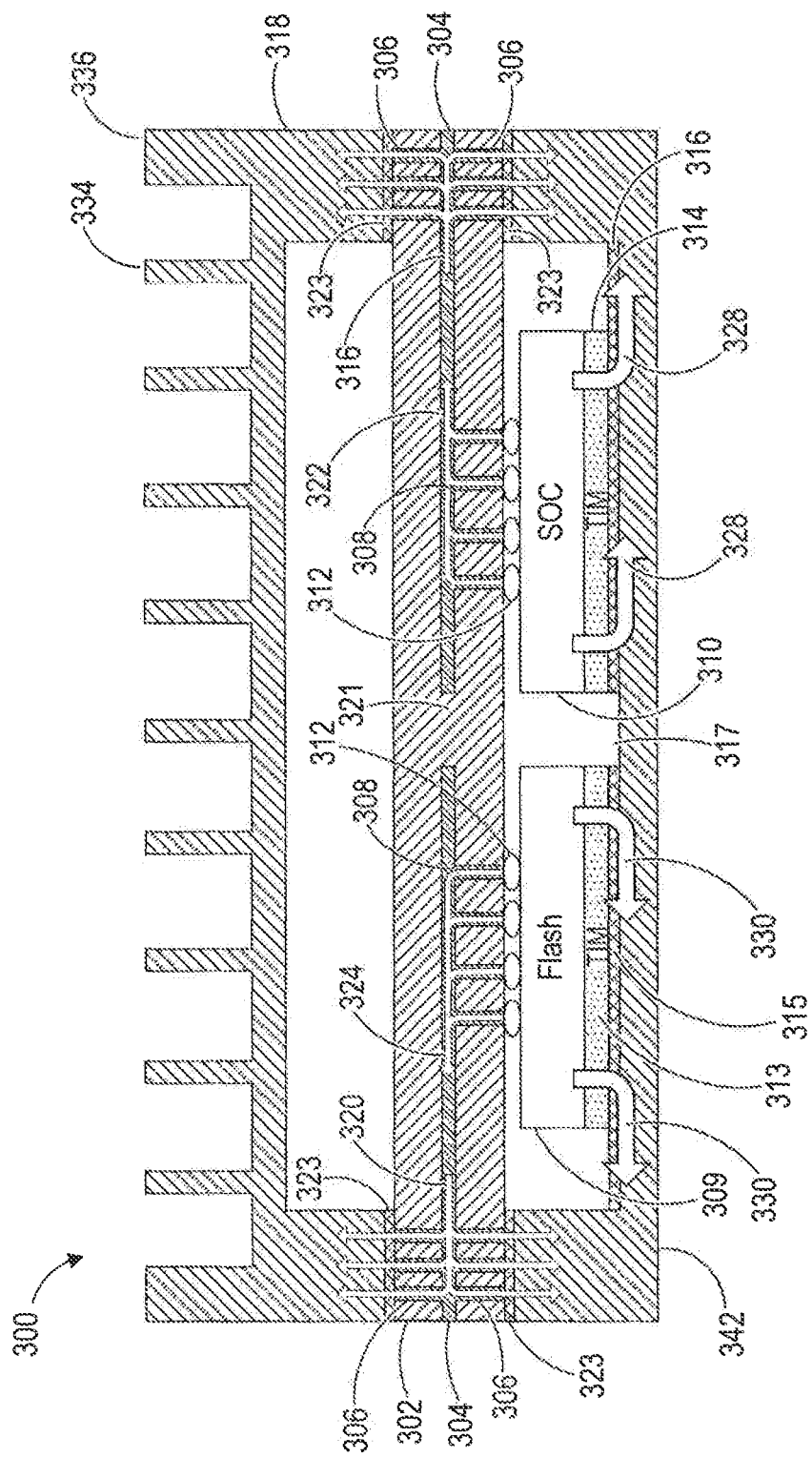
FIG. 3 is a cross-section view of an SSD according to an embodiment.

FIG. 1 shows a cross-section view of solid-state drive (SSD) 100 according to one embodiment. As will be appreciated by those of ordinary skill in the art, the cross-section views of FIGS. 1 to 3 are not drawn to scale to provide a clearer understanding of the present disclosure.

As shown in FIG. 1, SSD 100 includes a frame with upper frame portion 118 and lower frame portion 142, with printed circuit board (PCB) 102 mounted into or on lower frame portion 142. Upper frame portion 118 and lower frame portion 142 are sized to fit a particular form factor for SSD 100 such as a 2.5 inch form factor. Frame portions 118 and 142 can be comprised of a thermally conductive material to dissipate heat from SSD 100. Such a frame material can include, for example, an aluminum alloy such as 6061-T6 with a thermal conductivity of 167 W/mK.

System on a chip (SOC) 110 is mounted on a bottom side of PCB 102 along with DDR 104, and flash memories 108 and 114. As shown in FIG. 1, DDR 113 and flash memories 106 and 116 are mounted on a top side of PCB 102. Although one arrangement of heat generating components is shown in FIG. 1, those of ordinary skill in the art will appreciate that the present disclosure is not limited to the specific quantities or a particular arrangement of components on PCB 102. For example, other embodiments can include more or less of the components shown in FIG. 1 mounted on a single side of PCB 102.

SOC 110 is an integrated circuit (IC) which can serve as a controller for managing data in SSD 100. DDRs 113 and 104 are ICs which provide volatile memory for storing data. DDRs 113 and 104 can include, for example, double data rate synchronous dynamic random-access memory (DDR SDRAM) such as DDR SDRAM, DDR2 SDRAM, or DDR3 SDRAM.

In the example of FIG. 1, flash memories 106, 108, 120 and 122 provide a non-volatile memory (NVM) for storing data and can include, for example, NAND flash memory. While the example of FIG. 1 includes flash memory, other embodiments can include any type of solid-state memory. In this regard, such solid-state memory may comprise one or more of various types of memory devices such as Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM chips, or any combination thereof.

SSD 100 also includes thermal interface material (TIM) layers 112, 114, 116, 117 and 119 which provide thermally conductive layers between portions of the frame on one side and components mounted on PCB 102 on another side. TIM layers 112, 114, 116, 117 and 119 can include any thermal interface material or combination of materials known in the art for conducting heat such as a phase change metal alloy (PCMA), graphene, or a silicone based material. In one example, TIM layers 112, 114, 116, 117 and 119 can have a thermal conductivity of 1 to 6 W/mK in a particular direction through the TIM layers. In addition, the TIM layers can include a flexible material or a thermal grease to improve thermal conductivity by filling air gaps due to surface imperfections on frame portions 118 and 142 and on components mounted on PCB 102.

As shown in FIG. 1, TIM layer 112 is separated from (i.e., not in direct contact with) TIM layer 117 along the inside surface of lower frame portion 142 by gap 115 which can include air. One reason for separating TIM layers is to reduce heat transfer from a higher heat generating component to other components of SSD 100. In the example of FIG. 1, TIM layer 112 is separated from TIM layer 117 to reduce heat transfer from SOC 110 to DDR 104 and flash memories 108 and 114 since these components may be susceptible to overheating. In addition, SOC 110 ordinarily generates significantly more heat than DDR 104 and flash memories 108 and 114. For example, when using a peripheral component interconnect exchange (PCIe) standard, SOC 110 may generate 2 to 8 Watts compared to approximately 300 milliwatts generated by DDRs 104 and 113, and approximately 500 milliwatts generated by flash memories 106, 108, 120 and 122. TIM layers 112 and 117 are therefore separated to prevent heat transfer from SOC 110 to other components of SSD 100.

In addition, TIM layers 114 and 117 are separated from each other along the inside surface of lower frame portion 142 by gap 105 to reduce heat which might otherwise conduct between DDR 104 and flash memories 108 and 122. Similarly, TIM layers 116 and 119 are separated from each other by gap 107 along the inside surface of upper frame portion 118.

The example of FIG. 1 also includes graphene layers 123 (i.e., graphite sheets) between upper frame portion 118 and lower frame portion 142 which act as a heat spreader and thermally conductive layer between upper frame portion 118 and lower frame portion 142. Graphene layers 123 ordinarily allow for better heat transfer between upper frame portion 118 and lower frame portion 142. Due to its high thermal conductivity (approximately 1500 Watts/meter-Kelvin in a parallel x-y plane and approximately 15 Watts/meter-Kelvin in a perpendicular z plane), graphene may also be used in TIM layers 112, 114, 116, 117 and 119.

In other embodiments, graphene layers 123 may be omitted so that frame portions 118 and 142 are in direct contact with each other. In yet other embodiments, graphene layers 123 may be replaced with a different type of thermally conductive layer such as a thermal grease.

FIG. 2 shows a cross-section view of a portion of SSD 200 according to an embodiment. As shown in FIG. 2, SSD 200 includes frame 218 which is mounted on PCB 202. SOC 210 is also mounted on PCB 202 via solder balls 212. PCB 202 includes plane 204 which serves as a thermally conductive layer on one side of SOC 210. Plane 204 can include copper and may also serve as an electrical conductor for providing a ground or for transmitting a signal between components mounted on PCB 202 such as SOC 210 and memory components (not shown). On the other hand, plane 204 can be a dedicated thermal conduction plane to direct heat transfer from SOC 210 to frame 218 without connecting to other components on PCB 202.

As understood by those of ordinary skill in the art, PCB 202 may include multiple planes. Certain planes, such as plane 204, may be predisposed for thermal conduction by being thicker than other planes and/or using a material (e.g., copper) with a heavier weight and/or a higher thermal conductivity than materials in other planes. In addition, such thermal conduction planes may be located closer to an outer surface of PCB 202 to better improve heat transfer.

As shown in FIG. 2, SOC 210 is connected to plane 204 through balls 212 and vias 208 (e.g., microvias). Balls 212 can be part of a ball grid array (BGA) for mounting SOC 210 on PCB 202. It will be understood by those of ordinary skill in the art that the quantities of balls and vias in FIG. 2 are used for illustrative purposes and that actual quantities of balls and vias may differ without departing from the scope of the present disclosure.

Vias 206 provide a thermally conductive path from plane 204 to frame 218 through graphene layers 223. In the example of FIG. 2, frame 218 is connected to PCB 202 so as to define a first thermally conductive path between the frame and SOC 210. The first thermally conductive path is illustrated with arrows 222 and 220, which represent heat being extracted from SOC 210 to frame 218 through balls 212, vias 208, plane 204, vias 206 and graphene layers 223. As with the thermal conduction planes discussed above, certain vias such as vias 206 and/or vias 208 may be predisposed for thermal conduction by being thicker than other vias and/or by using a material (e.g., copper) with a heavier weight and/or a higher thermal conductivity than materials in other vias. In addition, such thermal conduction vias may be located to better improve heat transfer.

On the opposite side of SOC 210, TIM layer 214 is located between SOC 210 and graphene layer 216 so as to define a second thermally conductive path between frame 218 and SOC 210. In one embodiment, by having two thermally conductive paths for SOC 210, it is ordinarily possible to increase heat extraction from SOC 210 to frame 218 where heat from SSD 200 can dissipate from the exterior of frame 218.

The second thermally conductive path is illustrated with arrows 228 which represent heat being extracted from SOC 210 to frame 218 through TIM layer 214 and graphene layer 216. Since graphene layer 216 extends along a length of frame 218, graphene layer 216 spreads heat over the interior surface of frame 218 to increase heat transfer to frame 218.

TIM layer 214 can include any thermal interface material or combination of materials known in the art for conducting heat such as a phase change metal alloy (PCMA), graphene, or a silicone based material. In addition, TIM layer 214 can include a flexible material or a thermal grease to improve thermal conductivity by filling air gaps due to surface imperfections on SOC 210. In other embodiments, TIM layer 214 or graphene layer 216 may be omitted from the second thermally conductive path such that the thermally conductive layer between SOC 210 and frame 218 only includes graphene layer 216 or TIM layer 214.

FIG. 3 shows a cross-section view of a portion of SSD 300 according to an embodiment. As shown in FIG. 3, SSD 300 includes upper frame portion 318 and lower frame portion 342 which are mounted on PCB 302, SOC 310 and flash memory 309 are also mounted on a bottom side of PCB 302 via balls 312.

PCB 302 includes plane 304 which serves as a thermally conductive layer on one side of flash memory 309 and SOC 310. Plane 304 can include copper and may also serve as an electrical conductor for providing a ground or for transmitting a signal between other components mounted on PCB 302.

As understood by those of ordinary skill in the art, PCB 302 may include multiple planes. In this regard, certain planes, such as plane 304 may be predisposed for thermal conduction as discussed above with reference to FIG. 2. In addition, such thermal conduction planes may be located closer to an outer surface of PCB 302 to better improve heat transfer.

As shown in FIG. 3, plane 304 includes break 321 such that plane 304 is not continuous across its total length. Breaks such as break 321 may serve to direct heat transfer and/or reduce heat transfer from high heat components such as SOC 310 to lower heat components such as flash memory 309. Other embodiments may also include multiple dedicated thermal conduction planes within PCB 302 to direct heat transfer and/or reduce heat transfer between components mounted on PCB 302.

As shown in FIG. 3, flash memory 309 and SOC 310 are connected to plane 304 through balls 312 and vias 308. In the example of FIG. 3, upper frame 318 and lower frame 342 are connected to PCB 302 so as to define thermally conductive paths between the frame and SOC 310.

From flash memory 309, there are two thermally conductive paths to the frame. The first thermally conductive path from flash memory 309 is illustrated with arrows 320 and 324 which represent heat being extracted from flash memory 309 to frame portions 318 and 342 through balls 312, vias 308, plane 304, vias 306, and a graphene layer 323. As noted above with reference to FIG. 2, vias 306 and 308 may be predisposed for thermal conduction by being thicker than other vias and/or using a material (e.g., copper) with a heavier weight and/or a higher thermal conductivity than materials in other vias. In addition, such thermal conduction vias may be located to better improve heat transfer.

The second thermally conductive path from flash memory 309 is illustrated with arrows 330 which represent heat being extracted from flash memory 309 to lower frame portion 342 through TIM layer 313 and graphene layer 315. As noted above, by having two thermally conductive paths for a heat generating component, it is ordinarily possible to increase heat extraction from the heat generating component to the frame where heat can dissipate from SSD 300.

In addition to break 321 in plane 304, FIG. 3 shows gap 317 between TIM layers 313 and 314 and between graphene layers 315 and 316. Gap 317 may include air to reduce conduction of heat between flash memory 309 and SOC 310. In addition, graphene layers 315 and 316 extend in opposite directions from gap 317 which further directs heat from gap 317 as a result of the high thermal conductivity along the lengths of graphene layers 315 and 316.

As with flash memory 309, there are two thermally conductive paths from SOC 310 to the frame. The first thermally conductive path from SOC 310 is illustrated with arrows 316 and 322 which represent heat being extracted from SOC 310 to frame portions 318 and 342 through balls 312, vias 308, plane 304, vias 306, and a graphene layer 323. As noted above with reference to FIG. 2, vias 306 and 308 may be predisposed for thermal conduction by being thicker than other vias and/or using a material (e.g., copper) with a heavier weight and/or a higher thermal conductivity than materials in other vias. In addition, such thermal conduction vias may be located to better improve heat transfer.

The second thermally conductive path from SOC 310 is illustrated with arrows 328 which represent heat being extracted from SOC 310 to lower frame portion 342 through TIM layer 314 and graphene layer 316. As noted above, by having two thermally conductive paths for a heat generating component, it is ordinarily possible to increase heat extraction from the heat generating component to the frame where heat can dissipate from SSD 300.

In the example of FIG. 3, upper frame portion 318 includes exterior protrusions such as fins 334 and 336 which have different shapes to improve fluid flow over SSD 300 for convective cooling. The shapes and sizes of the exterior protrusions can vary based on different design considerations. As discussed in more detail below with reference to FIGS. 4 to 6, exterior protrusions on the frame ordinarily improve heat transfer with exterior fluids (e.g., air, helium) by increasing a surface area of the frame and/or by adding material to the frame for heat sinking, FIGS. 4A and 4B provide a top view and a side view of an exterior of SSD 400 according to an embodiment. SSD 400 includes upper frame portion 420 (i.e., top cover) with exterior protrusions such as fins 434 and 436 which define channels between the exterior protrusions. The exterior protrusions ordinarily improve heat transfer from SSD 400 to an ambient fluid such as air or helium by increasing the exterior surface area of the frame.

In the example of FIGS. 4A and 4B, a fluid flows over SSD 400 to provide convective cooling. In addition, the extra surface area of the exterior protrusions increases heat dissipation from SSD 400 when fluid is not flowing over SSD 400. The exterior protrusions also add mass to the frame for heat sinking.

Although the exterior frame protrusions in FIGS. 4A and 4B are depicted as fins having a rectangular shape, other embodiments can include exterior protrusions having a different shape such as a cylindrical shape (i.e., pins) to increase the surface area and/or mass of the frame.

Upper frame portion 420 and/or lower frame portion 418 can be etched to remove coatings from the frame that may otherwise hinder thermal conductivity. In particular, SSD 400 can be etched at specific locations where SSD 400 is to be mounted so as to provide thermally conductive paths from the exterior of SSD 400. Such etching can be performed with an etching laser or a chemical removal of surface coatings.

As shown in FIGS. 4A and 4B, SSD 400 includes raised portion 440 which provides an area for locating thermally conductive label 438. Labels may be provided as part of a standard for indicating characteristics of a data storage device on its exterior. Thermally conductive label 438 can be made of aluminum or another material having a relatively high (non-insulating) thermal conductivity to dissipate heat from SSD 400 in an area which might otherwise not dissipate much heat with a conventional label. Label 438 may also include a thermally conductive adhesive for affixing label 438 to SSD 400 while allowing for heat dissipation.

Raised portion 440 also serves to house components in SSD 400 which would not otherwise fit under upper frame portion 420. By housing taller components under raised portion 440, exterior protrusions can be added to areas around raised portion 440 without increasing an overall height of SSD 400. In this regard, raised portion 440 may also be used to house stacked PCBs within SSD 400 to achieve a smaller footprint for SSD 400 while allowing room for exterior protrusions within an overall height specification for SSD 400.

As shown in FIGS. 4A and 4B, raised portion 440 includes ramp 442 on its right side so as to reduce the turbulence of fluid flowing raised portion 440. Ramp 442 includes exterior protrusions on its top surface and can be positioned to receive a flow from a particular direction such as from a fan (not shown) outside of SSD 400. In FIGS. 4A and 4B, fluid flows from the right side of SSD 400 toward the left side of SSD 400. Other embodiments may include other modifications to frame portions such as lower frame portion 418 or upper frame portion 420 to increase fluid flow over SSD 400 and thereby increase convective cooling of SSD 400.

Figure 5C:
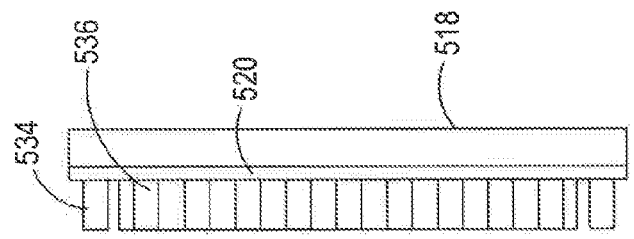
FIG. 5C provides a different side view of the exterior of the SSD of FIGS. 5A and 5B according to an embodiment.
Figure 5A:
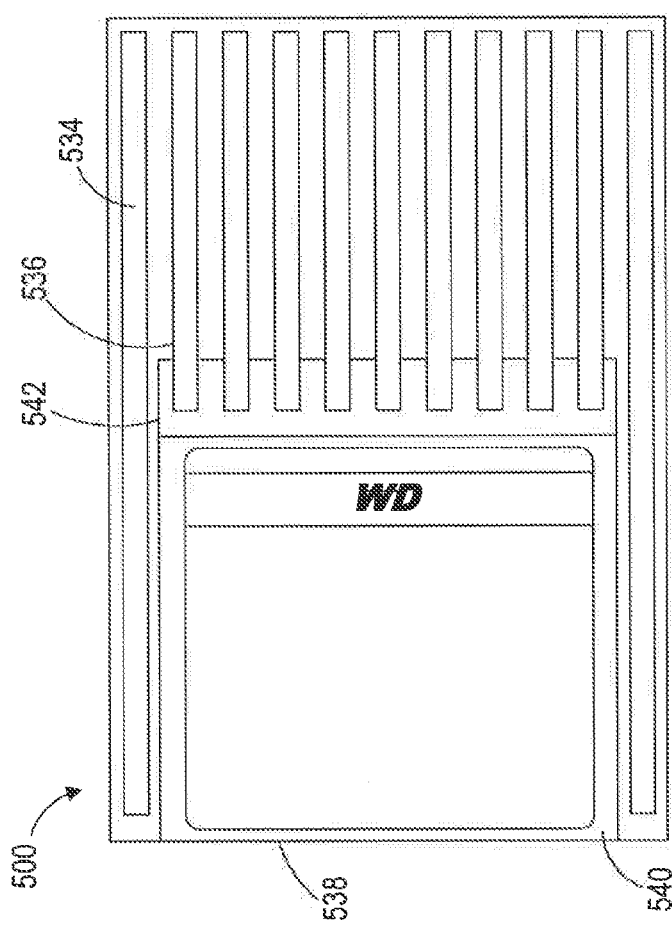
FIG. 5A provides a top view of an exterior of an SSD according to an embodiment.
Figure 5B:
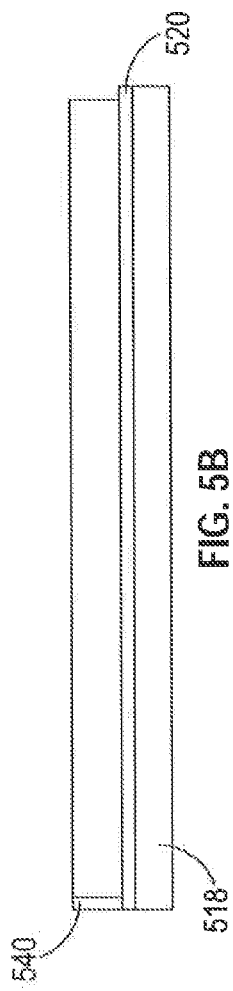
FIG. 5B provides a side view of an exterior of the SSD of FIG. 5A according to an embodiment.

FIGS. 5A, 5B and 5C provide top and side views of an exterior SSD 500 according to an embodiment. SSD 500 includes exterior protrusions such as fins 534 and 536 which define channels on upper frame portion 520 between the fins. In comparison to the fins of SSD 400, the fins of SSD 500 are longer in a direction of fluid flow over SSD 500. The longer fins of SSD 500 ordinarily reduce turbulence and increase the fluid flow over SSD 500 to increase heat dissipation from SSD 500.

SSD 500 also includes a lower frame portion 518, a thermally conductive label 538, a raised portion 540, and a ramp 542. As shown in FIG. 5A, exterior protrusions such as fin 536 cut into ramp 542. As with SSD 400 of FIGS. 4A and 4B, the frame of SSD 500 may also be etched to remove coatings from the frame that may hinder thermal conductivity.

FIGS. 6A, 6B and 6C provide top and side views of an exterior of SSD 600 according to an embodiment. SSD 600 includes exterior protrusions such as fins 634, 636, and 642 which define channels on upper frame portion 620 between the fins. Unlike SSD 500, the exterior protrusions of SSD 600 define channels in two directions. Although the fins of SSD 600 are longer in a direction of fluid flow over SSD 600, channels are provided along a width of the fins to increase a surface area of upper frame portion 620 and/or improve convective cooling from a fluid flow in a second direction.

As shown in FIGS. 6A, 6B and 6C, SSD 600 also includes lower frame portion 618, raised portion 640 and thermally conductive label 638.

The foregoing description of the disclosed example embodiments is provided to enable any person of ordinary skill in the art to make or use the embodiments in the present disclosure. Various modifications to these examples will be readily apparent to those of ordinary skill in the art, and the principles disclosed herein may be applied to other examples without departing from the spirit or scope of the present disclosure. The described embodiments are to be considered in all respects only as illustrative and not restrictive and the scope of the disclosure is, therefore, indicated by the following claims rather than by the foregoing description. All changes which come within the meaning and range of equivalency of the claims are to be embraced within their scope.

What is claimed is:

1. An electronic device comprising:
    a printed circuit board (PCB) including a thermal conduction plane;
    at least one heat generating component mounted on the PCB and connected to the thermal conduction plane through at least one via, wherein the at least one via is located between the at least one heat generating component and the thermal conduction plane and formed directly above or directly beneath the at least one heat generating component;
    a frame connected to the PCB so as to define a first thermally conductive path between at least a portion of the frame and the at least one heat generating component from the at least one heat generating component through the at least one via and the thermal conduction plane; and
    at least one thermally conductive layer between the frame and the at least one heat generating component so as to define a second thermally conductive path between at least a portion of the frame and the at least one heat generating component.

2. The electronic device of claim 1, wherein the at least one thermally conductive layer includes a graphene layer.

3. The electronic device of claim 1, wherein the at least one heat generating component includes a first heat generating component and a second heat generating component,
    wherein the at least one thermally conductive layer includes a first thermally conductive layer between the frame and the first heat generating component and a second thermally conductive layer between the frame and the second heat generating component, and
    wherein the first thermally conductive layer does not directly contact the second thermally conductive layer so as to reduce heat transfer between the first and second heat generating components.

4. The electronic device of claim 1, wherein the PCB includes a plurality of planes and the thermal conduction plane is predisposed for thermal conduction based on a location of the thermal conduction plane, a size of the thermal conduction plane, and/or a material composition of the thermal conduction plane.

5. The electronic device of claim 1, wherein the thermal conduction plane is not continuous across a total length of the thermal conduction plane so as to direct heat transfer in the thermal conduction plane.

6. The electronic device of claim 1, wherein the frame includes a first portion and a second portion and the electronic device further comprises at least one graphene layer between the first and second portions of the frame.

7. The electronic device of claim 1, wherein the PCB is mounted on the frame and the electronic device further comprises at least one graphene layer between the PCB and the frame.

8. The electronic device of claim 1, wherein the frame includes exterior protrusions to increase heat dissipation from the electronic device.

9. The electronic device of claim 1, further comprising a thermally conductive label attached to the frame, the label configured to indicate characteristics of the electronic device and dissipate heat from the electronic device.

10. The electronic device of claim 9, wherein the thermally conductive label comprises aluminum.

11. The electronic device of claim 9, wherein the thermally conductive label includes a thermally conductive adhesive.

12. The electronic device of claim 1, wherein at least a portion of the exterior of the frame is etched to remove a coating from the frame.

13. The electronic device of claim 1, wherein the frame includes a raised portion housing components of the device which extend beyond portions of the frame that are not raised.

14. The electronic device of claim 13, wherein the raised portion includes a ramp to reduce turbulence of a fluid flowing over the raised portion.

15. The electronic device of claim 1, wherein the electronic device is a solid-state drive for storing data.

16. An electronic device comprising:
    a printed circuit board (PCB) including a thermal conduction plane;
    at least one heat generating component mounted on the PCB and connected to the thermal conduction plane;
    a frame connected to the PCB so as to define a first thermally conductive path between at least a portion of the frame and the at least one heat generating component, wherein the frame includes a first portion with a first surface and a second portion with a second surface, the second surface directly above or directly beneath the first surface;
    at least one thermally conductive layer between the frame and the at least one heat generating component so as to define a second thermally conductive path between at least a portion of the frame and the at least one heat generating component; and
    at least one graphene layer between the first surface of the first portion of the frame and the second surface of the second portion of the frame.

17. The electronic device of claim 16, wherein the at least one thermally conductive layer includes a graphene layer.

18. The electronic device of claim 16, wherein the at least one heat generating component includes a first heat generating component and a second heat generating component,
    wherein the at least one thermally conductive layer includes a first thermally conductive layer between the frame and the first heat generating component and a second thermally conductive layer between the frame and the second heat generating component, and
    wherein the first thermally conductive layer does not directly contact the second thermally conductive layer so as to reduce heat transfer between the first and second heat generating components.

19. The electronic device of claim 16, wherein the PCB includes a plurality of planes and the thermal conduction plane is predisposed for thermal conduction based on a location of the thermal conduction plane, a size of the thermal conduction plane, and/or a material composition of the thermal conduction plane.

20. The electronic device of claim 16, wherein the thermal conduction plane is not continuous across a total length of the thermal conduction plane so as to direct heat transfer in the thermal conduction plane.

21. The electronic device of claim 16, wherein the PCB is mounted on the frame and the electronic device further comprises at least one graphene layer between the PCB and the frame.

22. The electronic device of claim 16, wherein the frame includes exterior protrusions to increase heat dissipation from the electronic device.

23. The electronic device of claim 16, further comprising a thermally conductive label attached to the frame, the label configured to indicate characteristics of the electronic device and dissipate heat from the electronic device.

24. The electronic device of claim 23, wherein the thermally conductive label comprises aluminum.

25. The electronic device of claim 23, wherein the thermally conductive label includes a thermally conductive adhesive.

26. The electronic device of claim 16, wherein at least a portion of the exterior of the frame is etched to remove a coating from the frame.

27. The electronic device of claim 16, wherein the frame includes a raised portion housing components of the device which extend beyond portions of the frame that are not raised.

28. The electronic device of claim 27, wherein the raised portion includes a ramp to reduce turbulence of a fluid flowing over the raised portion.

29. The electronic device of claim 16, wherein the electronic device is a solid-state drive for storing data.

* * * * *